US009979367B2

(12) United States Patent
Rombach et al.

(10) Patent No.: US 9,979,367 B2
(45) Date of Patent: May 22, 2018

(54) CIRCUIT AND METHOD OF OPERATING A CIRCUIT

(71) Applicant: Epcos AG, München (DE)

(72) Inventors: Pirmin Hermann Otto Rombach, Kongens Lyngby (DK); Niels Marker-Villumsen, Måløv (DK)

(73) Assignee: TDK Corporation, Tokyo (JP)

( * ) Notice: Subject to any disclaimer, the term of this patent is extended or adjusted under 35 U.S.C. 154(b) by 0 days. days.

(21) Appl. No.: 15/306,534

(22) PCT Filed: May 8, 2014

(86) PCT No.: PCT/EP2014/059488
§ 371 (c)(1),
(2) Date: Oct. 25, 2016

(87) PCT Pub. No.: WO2015/169379
PCT Pub. Date: Nov. 12, 2015

(65) Prior Publication Data
US 2017/0163231 A1 Jun. 8, 2017

(51) Int. Cl.
*H03G 3/20* (2006.01)
*H03G 3/30* (2006.01)
(Continued)

(52) U.S. Cl.
CPC ............. *H03G 3/301* (2013.01); *H03F 1/32* (2013.01); *H03F 3/183* (2013.01); *H04R 3/00* (2013.01); *H04R 2201/003* (2013.01)

(58) Field of Classification Search
CPC .......... H03F 3/30; H03F 3/301; H03F 3/3026; H03G 3/30; H03G 3/301; H03G 3/3026
(Continued)

(56) References Cited

U.S. PATENT DOCUMENTS 5,808,575 A  9/1998 Himeno
2003/0062885 A1  4/2003 Ballan
(Continued)

FOREIGN PATENT DOCUMENTS

EP  0283299 A2  9/1988
EP  1271771 A1  1/2003
(Continued)

OTHER PUBLICATIONS

European Patent Office, International Search Report and Written Opinion of International Searching Authority for PCT/EP2014/059488, dated Jan. 27, 2015 (9 pages).
(Continued)

*Primary Examiner* — Steven J Mottola
(74) *Attorney, Agent, or Firm* — Nixon Peabody LLP

(57) ABSTRACT

A circuit having a first amplifier with a variable gain, a second amplifier with a variable gain configured to provide an output signal, a control unit, a memory element, and a switching member. The control unit is configured to adjust the variable gain of the first amplifier and the variable gain of the second amplifier. The memory element is configured to store a sample of the output signal. The switching member is configured to connect an output port of the circuit to either the second amplifier or to the memory element. A method of operating this circuit is also disclosed.

22 Claims, 2 Drawing Sheets

(51) Int. Cl.
  *H03F 3/183* (2006.01)
  *H03F 1/32* (2006.01)
  *H04R 3/00* (2006.01)

(58) Field of Classification Search
  USPC .......................................... 330/2, 129, 133
  See application file for complete search history.

(56) References Cited

U.S. PATENT DOCUMENTS

| | | |
|---|---|---|
| 2003/0083031 A1 | 5/2003 | Eriksson et al. |
| 2003/0218501 A1* | 11/2003 | Oshima ................ H03G 3/3052 330/133 |
| 2005/0107054 A1 | 5/2005 | Nakayama |
| 2009/0175468 A1 | 7/2009 | Cheng et al. |

FOREIGN PATENT DOCUMENTS

| | | |
|---|---|---|
| EP | 1517440 A2 | 3/2005 |
| JP | H7-307994 A | 11/1995 |
| JP | H9-130245 A | 5/1997 |
| JP | 2003-78490 A | 3/2003 |
| JP | 2005-94178 A | 4/2005 |
| JP | 2007093677 A | 12/2007 |
| JP | 2009207083 A | 10/2009 |
| WO | 2004095709 A2 | 11/2004 |
| WO | 2015169379 A1 | 11/2015 |

OTHER PUBLICATIONS

European Patent Office, International Preliminary Report on Patentability for PCT/EP2014/059488, dated Nov. 8, 2016 (6 pages).

* cited by examiner

CIRCUIT AND METHOD OF OPERATING A CIRCUIT

CROSS-REFERENCE TO RELATED APPLICATIONS

This application is a U.S. National Stage of International Application No. PCT/EP2014/059488, filed May 8, 2014, which is incorporated herein by reference in its entirety.

The present invention concerns a circuit and a method of operating a circuit. In particular, the circuit is configured to receive an input signal, to amplify the input signal and to provide an output signal corresponding to the amplified signal. Moreover, the circuit may be configured to convert an analog input signal into a digital output signal.

The input signal may be provided by a MEMS microphone. Accordingly, the circuit may be an analog-to-digital conversion channel for audio signals. In an analog-to-digital conversion channel for audio signals, achieving both a high signal-to-noise ratio and the capability of handling large input signals is challenging.

In order to increase the dynamic gain, amplifiers with variable gain are used. An automatic gain control system comprising an analog variable gain amplifier, an analog-to-digital converter, a digital variable gain amplifier and an automatic gain controller can be used. With this system, for large input signals the analog gain of the analog variable gain amplifier can be reduced to avoid signal clipping in the analog variable gain amplifier and/or in the analog-to-digital converter. To maintain a constant channel sensitivity, the reduction in the analog gain is compensated by an increase in the gain of the digital variable gain amplifier.

However, a disadvantage of this system is that, when the analog gain and the digital gain are changed, a transient audible glitch is created in the circuit. The glitch is created due to the time-delay in the conversion channel. In particular, a digital variable gain amplifier is enabled to carry out a change in its variable gain instantaneously as its components are digital. However, the analog variable gain amplifier carries out the change in its gain setting exponentially over time as its components require a ramp-up time to adjust to its settings. For example, a capacitor requires a certain time to adjust its capacitance. Thus, in a short period of time after the changes of the two gain settings, the overall gain is not constant. Thereby, the transient glitch is created, resulting in an audible distortion of the output signal.

The peak value of the glitch depends on the change of the gain in the analog variable gain amplifier and the gain of the digital variable gain amplifier, wherein a smaller gain change creates a less audible transient glitch in the output signal.

WO 2004/095709 A2 describes a solution to remove the glitch in such a system. Here, a gain of an analog variable gain amplifier and a gain of a digital variable gain amplifier are not changed simultaneously. Instead, the gain of the analog variable gain amplifier is changed at a time t1 and the gain of the digital variable gain amplifier is changed at a time t2 different from t1. The difference between t2 and t1 roughly equals the delay in the analog-to-digital conversion channel from the output of the analog variable gain amplifier to the input of the digital variable gain amplifier. This allows to reduce the peak value of the transient glitch, but not to completely remove the glitch. Depending on the size of the gain change of the two amplifiers, the reduced transient glitch may still be audible. Thus, the solution requires using very small gain changes in order to make the transient glitch inaudible. Smaller gain changes increase the complexity of both of the analog variable gain amplifier and the digital variable gain amplifier. This method further requires a fine tuning of the delay in the channel from the analog variable gain amplifier output to the input of the digital variable gain amplifier in order to minimize the transient glitch optimally.

In US 2003/083031 A1 an alternative solution is described wherein two parallel and concurrently operating analog-to-digital conversion channels are used. Both channels comprise an analog variable gain amplifier, an analog-to-digital converter, a digital variable gain amplifier and an automatic gain control. When the input signal increases, the gain of the analog variable gain amplifier is reduced and simultaneously the gain of the digital variable gain amplifier is increasing by the same amount in one of the channels. This causes a transient glitch in this adapted channel. While the adapted channel settles due to the gain change, only the output of the respective other channel is fed to an overall channel output. Once the adapted channel has settled, the overall output is fed from this channel instead of the other channel. In this manner the transient glitch is avoided. However, this solution requires two identical and concurrently running channels. Accordingly, this solution doubles the circuit area and the current consumption of the circuit. It also requires extra digital signal processing for combining the output signals from the two channels. Thus, this solution is not feasible for a low power application with limited circuit area.

It is an object of the present invention to provide a circuit which overcomes at least some of the above-discussed disadvantages. Moreover, it is another object to provide a method of operating such a circuit.

This object is solved by a circuit according to claim 1. The further object is solved by a method according to the second independent claim.

A circuit is proposed comprising a first amplifier with a variable gain, a second amplifier with a variable gain configured to provide an output signal, a control unit configured to adjust the variable gain of the first amplifier and the variable gain of the second amplifier, a memory element configured to store a sample of the output signal and a switching member configured to connect an output port of the circuit either to the second amplifier or to the memory element.

Thus, the circuit is configured such that the output port of the circuit can either be fed with the output signal from the second amplifier or with a signal stored in the memory element. Thereby, the circuit allows for removing the transient glitch by providing the stored signal during an adjustment time in which the glitch occurs.

Only the memory element and the switching member are required as additional components over a basic analog-to-digital conversion channel such that the glitch removal can be carried out with a minimal number of total components and with only a very small increase in the chip size.

Moreover, no added digital signal processes are required. Multiple copies of the same circuit block are also not required. Overall, the added area and the added current consumption of the circuit is much smaller than in the above cited prior art.

The sample stored by the memory element may correspond to the last N values of the signal outputted by the second amplifier. Thus, at a given point of time, the signal stored in the memory element corresponds to the latest signal provided by the second amplifier.

In particular, the memory element may comprise a memory block. Accordingly, the term "the memory element is configured to store a sample of the output signal" is to be understood such that the memory element stores or writes values in its memory block which corresponds to the recently provided output signal. The memory element may be configured to store N values in its memory block corresponding to the last N bits outputted by the second amplifier. These N values may define the stored sample.

The switching member is configured such that the output port of the circuit is connected at a given point of time either to the second amplifier or to the memory element. The switching member is configured to switch between a state wherein the output port is connected to the second amplifier and a state wherein the output port is connected to the memory element.

When the output port is connected to the second amplifier, the output signal from the second amplifier is provided at the output port as the output signal of the circuit. When the output port is connected to the memory block, a signal provided by the memory block may be provided at the output port as the output signal of the circuit.

Accordingly, the circuit may be configured to provide an output signal wherein the output signal is either the output signal of the second amplifier or a signal provided by the memory element.

In one embodiment, the memory element may be configured to provide a signal to the output port when the output port is connected to the memory element wherein the signal provided by the memory element is based on the stored sample.

When the memory element is connected to the output port, it may operate in a read-only manner such that no new values are stored in the memory element. In particular, the memory element may be connected to the output port by the switching member after a change in the gains of the first and the second amplifier has been carried out. In this case, the first and the second amplifier can settle to the adjustment of the gains. In this time, a glitch is present in the output signal of the second amplifier. However, the glitch does not reach the output port as the output port is connected to the memory element and not to the second amplifier. The stored sample from the memory element is provided to the output port, thereby effectively removing the glitch from the output signal of the circuit.

In one embodiment, the memory element is configured to provide a signal to the output port when the output port is connected to the memory element wherein the signal provided by the memory element is identical to the stored sample.

Thus, in this case, the last signal from the second amplifier before the adjustment of the gains is repeated at the output port. It can be assumed that the last signal before the adjustment is very close to the correct signal. The correct signal corresponds to an amplification of the input signal.

A distortion occurs when the output port is connected back to the second amplifier and the output signal of the second amplifier is again outputted at the output port. However, by repeating the last signal before the adjustment, it is ensured that the distortion will be very small in most cases.

In one embodiment, the memory element is configured to provide a signal to the output port when the output port is connected to the memory element wherein the signal provided by the memory element is an extrapolation of the stored sample.

This allows for an improved estimate of the correct signal during the time when the output port is connected to the memory element. Thus, the above discussed distortion will be reduced even further in most situations.

In one embodiment, the circuit may be configured such that the switching member connects the output port to the memory element for a predetermined period of time when the control unit adjusts the variable gain of the first amplifier and the variable gain of the second amplifier.

The predetermined period of time may be chosen such that it is longer than the ramp-up time required by the amplifiers to adjust to a change in their gain. The predetermined period of time may be chosen such that a transient glitch which occurs due to the gain change has settled before the end of the predetermined period of time. Further, the predetermined period of time is chosen as small as possible with the limit that the transient glitch has to be settled before the end of the predetermined period of time. The exact value of the predetermined period of time depends on the parameters of the amplifiers of the circuit. In particular, the predetermined period of time can be chosen in view of the first and the second amplifier. Thus, the circuit is robust against any variations in the time-delay of the two amplifiers, therefore allowing to use the circuit with all kinds of amplifiers.

In one embodiment, the circuit may be configured such that the switching member connects the output port to the second amplifier after the predetermined period of time.

Thus, after the predetermined period of time is elapsed, the output signal of the second amplifier may again be provided as an output signal of the circuit. This signal will be free from the glitch.

Further, in one embodiment the circuit may be configured such that, when the output port is connected to the second amplifier, the output signal of the second amplifier is constantly written into the memory element and the memory element constantly overwrites previously stored samples in a first-in, first-out manner. Thus, the sample stored in memory element corresponds to the latest output signal of the second amplifier when the output port is connected to the second amplifier.

In one embodiment, the circuit may be configured such that the memory element is prevented from overwriting the stored sample when the output port is connected to the memory element. In particular, the memory element may be configured to be in a read-only mode when connected to the output port.

In one embodiment, the control unit may be configured to adjust the variable gain of the second amplifier reciprocally proportional and simultaneously to an adjustment of the variable gain of the first amplifier.

The first amplifier may be an analog amplifier. The second amplifier may be a digital amplifier. The circuit may further comprise an analog-to-digital converter arranged between the first amplifier and the second amplifier. A sample rate of the analog-to-digital converter may be larger than the Nyquist rate for sampling of audio signals in the range from 20 Hz to 20 kHz.

The circuit may further comprise at least one filter. The filter may be a bandpass filter, a lowpass filter, a highpass filter, an allpass filter or a combination of different types of filters. The filter may be arranged in a main signal path connecting an input port of the circuit with the output port. Overall, the filter improves the quality of the provided output signal as the filter is configured to filter out unwanted noise.

The present invention further concerns a method of operating a circuit. The circuit may be the above-disclosed circuit. Thus, any structural or functional feature disclosed with respect to the circuit may also be present with respect to the method. Vice versa, any functional or structural feature disclosed with respect to the method may also be present with respect to the circuit.

The method comprises the steps of:
monitoring a first output signal of the first amplifier,
adjusting the variable gain of the first amplifier and the variable gain of the second amplifier if the first output signal is below a first predefined threshold level or above a second predefined threshold level,
connecting the memory element to the output port for a predetermined period of time if the variable gain of the first and the second amplifier is adjusted.

The first threshold level may be chosen such that it is exceeded when the first amplifier is close to its clipping threshold. The second threshold level may be chosen such that the first output signal falls below the second threshold level when a signal strength of the first output signal is weak.

The monitored output signal of the first amplifier may either be directly the output signal of the first amplifier or may be processed first, e.g. in an analog-to-digital converter and afterwards monitored.

The method may further comprise the step of connecting the second amplifier to the output port after the predetermined period of time.

BRIEF DESCRIPTION OF THE DRAWINGS

In the following, the disclosed circuit and the method are described in further detail with reference to the drawing, wherein.

DETAILED DESCRIPTION OF THE ILLUSTRATED EMBODIMENTS

Figure 1:
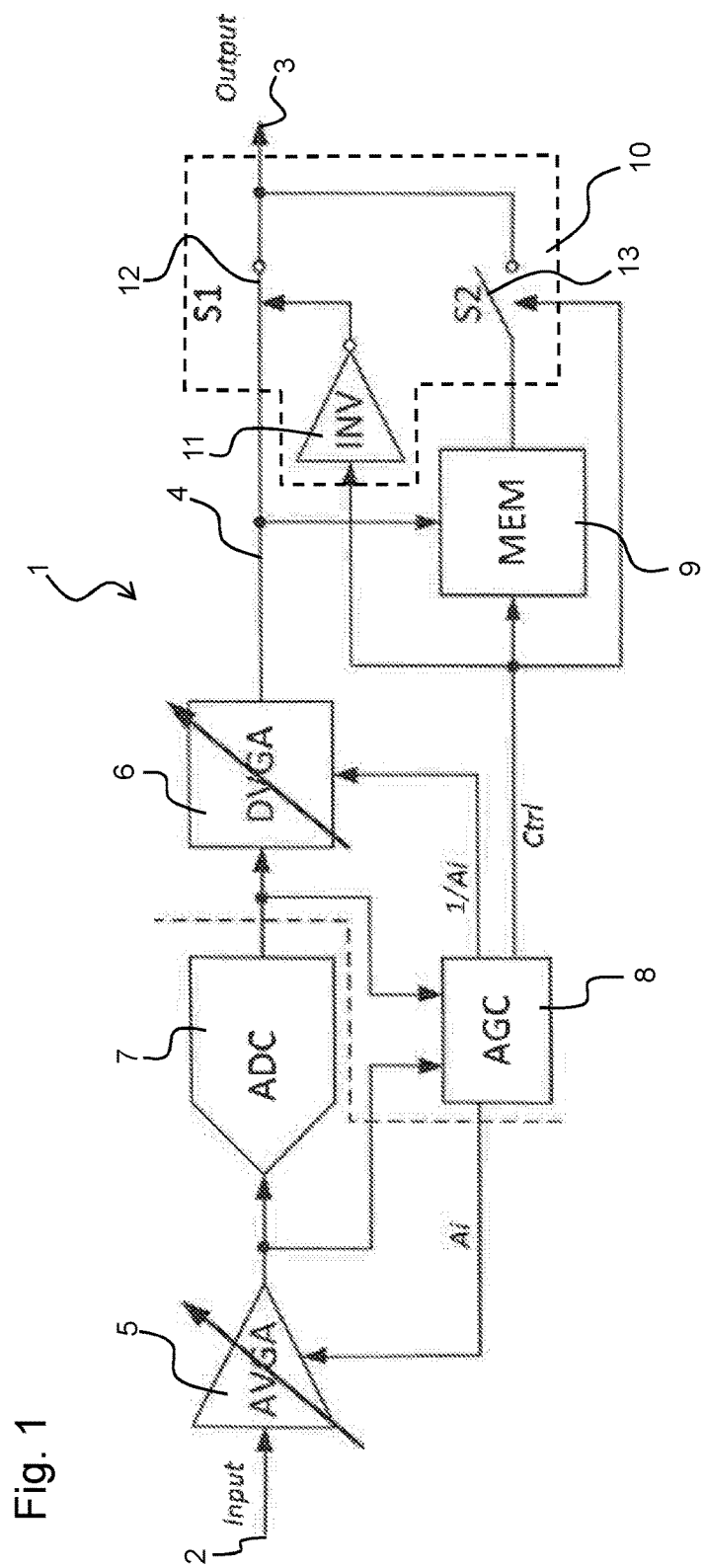
FIG. 1 shows a circuit.

FIG. 1 shows a circuit 1. The circuit 1 is configured to receive an input signal and to amplify the input signal. Further, the circuit 1 is configured to provide an output signal which is based on the received input signal.

In particular, the circuit 1 is configured to receive an input signal from a MEMS microphone (not shown). The input signal from the MEMS microphone is an analog signal.

Moreover, the circuit 1 is configured to convert an analog signal into a digital signal. Accordingly, the input signal is an analog signal and the output signal of the circuit 1 is a digital signal.

The circuit 1 comprises an input port 2. The circuit 1 further comprises an output port 3. The input port 2 and the output port 3 are connected by a main signal path 4. In the main signal path 4, a first amplifier 5 and a second amplifier 6 are arranged. The first amplifier 5 is connected to the input port 2. The first amplifier 5 is an analog amplifier. The first amplifier 5 is configured to receive an analog input signal from the input port 2 and to provide an analog output signal which corresponds to the input signal amplified by a first gain factor.

Between the first amplifier 5 and the second amplifier 6 an analog-to-digital converter 7 is arranged. The analog-to-digital converter 7 is configured to receive the analog output signal from the first amplifier 5 and to provide a corresponding digital output signal.

The analog-to-digital converter 7 can be of any type, for example a Delta-Sigma analog-to-digital converter, a flash analog-to-digital converter or a successive approximation analog-to-digital converter. If the analog-to-digital converter 7 is a Delta-Sigma converter, it may be continuous time, switched-capacitor or a hybrid of the two. The output of the analog-to-digital converter 7 can be single-bit or multi-bit.

The analog-to-digital converter 7 is connected to the second amplifier 6. The second amplifier 6 is a digital amplifier. Accordingly, the second amplifier 6 is configured to receive a digital signal from the analog-to-digital converter 7 and to provide an amplified digital output signal wherein the amplified digital output signal is amplified by a second gain factor.

Each of the first amplifier 5 and the second amplifier 6 has a variable gain. Accordingly, the first gain factor of the first amplifier 5 is variable. The second gain factor of the second amplifier 6 is also variable.

The circuit further comprises a control unit 8. The control unit 8 may be an automatic gain control. The control unit 8 is configured to adjust the variable gain of the first amplifier 5 and the variable gain of the second amplifier 6.

In the embodiment shown in FIG. 1, the control unit 8 receives the output signal of the first amplifier 5 and the output signal of the analog-to-digital converter 7 as input signals. However, in alternate embodiments, the control unit 8 may receive only one of said two signals as an input signal. When the input signal of the control unit 8 exceeds a first predefined threshold level or when the input signal of the control unit 8 is below a second predefined threshold level, the control unit 8 will adjust the variable gain of the first amplifier 5 and the variable gain of the second amplifier 6.

In particular, the variable gain of the first amplifier 5 and the variable gain of the second amplifier 6 are adjusted by the control unit 8 simultaneously and reciprocally proportional to each other. Accordingly, when the variable gain of the first amplifier 5 is adjusted by a factor $A_i$, the variable gain of the second amplifier 6 is adjusted by a factor $1/A_i$. Thus, an overall gain of the first amplifier 5 and the second amplifier 6 remains unchanged. The overall gain corresponds to the product of the gain of the first amplifier 5 multiplied with the gain of the second amplifier 6.

Moreover, the circuit 1 comprises a memory element 9. The memory element 9 is configured to receive the output signal of the second amplifier 6. In particular, the memory element 9 is configured to store a sample of the output signal of the second amplifier 6.

The circuit further comprises a switching member 10. The switching member 10 is configured to connect the output port 3 of the circuit 1 either to the second amplifier 6 or to the memory element 9. When the output port 3 is connected to the second amplifier 6, the output signal of the second amplifier 6 is provided as an output signal of the circuit 1. When the output port 3 is connected to the memory element 9, the memory element 9 is configured to provide an output signal based on the stored sample.

In the embodiment shown in FIG. 1, the switching member 10 comprises an inverter 11, a first switch 12 and a second switch 13. The first switch 12 is arranged in the main signal path 4 between the second amplifier 5 and the output port 3. The second switch 13 is arranged between the memory element 9 and the output port 3. The inverter 11 is arranged between the control unit 8 and the first switch 12. Thus, the inverter 11 is arranged such that it inverts a control signal sent by the control unit 8.

As discussed above, the control unit 8 is configured to send control signals to the first and the second amplifier 5, 6. Accordingly, the control unit 8 is configured to control the gain setting of the first and the second amplifier 5, 6. Moreover, the control unit 8 is also configured to control the operation of the memory element 9 and of the switching member 10.

The control unit 8 is configured to send a control signal to the switching member 10. As the inverter 11 inverts the control signal for the first switch 12, the control signal sent by the control unit 8 has an opposite command for the first switch 12 and for the second switch 13. Accordingly, at any given time, one of the first switch 12 and the second switch 13 is open and the respective other of the first switch 12 and the second switch 13 is closed.

Further, the memory element 9 is also configured to receive the control signal from the control unit 8. The command of control signal with respect to the memory element 9 will be discussed later-on.

The circuit 1 has a normal operation mode and a gain adjustment mode. FIG. 1 shows the circuit 1 in the normal operation mode.

The circuit 1 usually operates in the normal operation mode. The circuit 1 switches to the gain adjustment mode for a predetermined period of time, when the control unit 8 adjusts the variable gain of the first amplifier 5 and the variable gain of the second amplifier 6. The circuit 1 switches from the gain adjustment mode back to the normal mode when the predetermined period of time is elapsed.

The normal operation mode is characterized by the output port 3 of the circuit 1 being connected to the second amplifier 6 by the switching member 10. The gain adjustment mode is characterized by the output port 3 being connected to the memory element 9 by the switching member 10.

First, the normal operation mode of the circuit 1 is considered in detail. In the normal operation mode, the switching member 10 connects the second amplifier 6 to the output port 3. In particular, the first switch 12 is closed. The output signal of the second amplifier 6 is provided as an output signal of the circuit 1 at the output port 3.

Further, in the normal operation mode, the memory element 9 is configured to receive the output signal of the second amplifier 6. The output signal of the second amplifier 6 is constantly written into the memory element 9 and the memory element 9 constantly overwrites a previously stored sample in a first-in, first-out manner. A corresponding control signal is sent by the control unit 8 to the memory element 9.

In particular, the memory element 9 is configured to store N values. Thus, the memory element 9 is configured to store a sample consisting of the last N output values of the second amplifier 6. In each clock cycle, the present output value of the second amplifier 6 is written into the memory element 9. This latest value is stored in the memory element 9, thereby overwriting the value stored N clock cycles ago. The memory element 9 keeps the values in its memory block which have been stored in the previous N−1 clock cycles.

However, if a change of the variable gain of the first amplifier 5 and of the variable gain of the second amplifier 6 is carried out in the normal operation mode, this would result in a distortion of the output signal. This distortion is called glitch. In particular, in the above mention case, a transient audible glitch would be created.

The glitch is created due to an unavoidable time-delay in the adjustment for the variable gain of the first amplifier 5 and the second amplifier 6. As the first amplifier 5 is an analog amplifier, it needs a certain ramp-up time to amend its components to allow for the gain change. Accordingly, the gain of the first amplifier 5 is changed not instantaneously, but has an exponential change over time. In contrast to this, the second amplifier 6 is a digital amplifier which carries out a gain change instantaneously. Thus, in a short period of time after the control unit 8 sends a control signal to adjust the variable gains of the first and the second amplifier 5, 6, the product of the two gains is not constant. Thereby, the glitch is created.

The present invention removes the glitch from the output signal.

In the following, the gain adjustment mode of the circuit is considered in detail.

The circuit 1 is configured to switch from its normal operation mode to its gain adjustment mode when the variable gain of the first amplifier 5 and the variable gain of the second amplifier 6 are amended. Further, the circuit 1 is configured to switch from its gain adjustment mode to its normal operation mode when the predetermined period of time has passed wherein the predetermined period of time is started by a switch to the gain adjustment mode.

As an example, a situation is considered wherein the input signal has a very strong signal strength such that one of the first amplifier 5 and the analog-to-digital converter 7 is close to its clipping threshold. Accordingly, the input signal of the control unit 8 exceeds the first predefined threshold level. The first threshold of the control unit 8 is chosen such that it is exceeded when one of the first amplifier 5 and the analog-to-digital converter 7 is close to its clipping threshold.

When the control unit 8 detects that the input signal is too strong, it sends a control signal to the first amplifier 5 and to the second amplifier 6. The variable gain of the first amplifier 5 is reduced by a given factor according to the control signal. At the same time, the control unit 8 increases the variable gain of the second amplifier 6 by the same factor. The given factor can in principle have any value. The exact value of the given factor depends on the programming of the control unit 8. Further, the possible values that may be chosen for the given factor also depend on the configuration of each of the first amplifier 5 and the second amplifier 6. In particular, each of the first amplifier 5 and the second amplifier 6 has a defined range of values to which the respective variable gain can be set. Thus, the given factor has to be chosen such that the variable gain of each of the first amplifier 5 and the second amplifier 6 is within this range.

Further, the control unit 8 sends a control signal to the memory element 9 and to the switching member 10. The memory element 9 stops writing new values to its memory block. Further, the switching member 10 connects the memory element 9 to the output port 3 and disconnects the second amplifier 6 from the output port 3. In particular, the control signal orders the second switch 13 to close. Accordingly, in the gain adjustment mode, the memory element 9 is connected to the output port 3 via the closed second switch 13. Further, the inverter 11 inverts the command "close" into the command "open" such that the first switch 12 is opened. Thus, the second amplifier 6 is disconnected from the output port 3.

Further, the control unit 8 orders the memory element 9 to provide an output signal to the output port 3 wherein the output signal is based on the stored sample.

In particular, the values of the stored sample of the memory element 9 are fed into the output port 3 in a first-in, first-out manner. This is be repeated multiple times, e.g. M times. The predetermined period of time corresponds to N-times M clock cycles.

After the predetermined period of time is elapsed, the circuit 1 switches back to its normal operation mode. In particular, after the predetermined period of time is elapsed, the control unit 8 sends a control signal to the memory element 9 such that the memory element 9 stops sending an output signal and, instead, starts storing new values from the output signal of the second amplifier 6. At the same time, the control signal changes the state of the switching member 10 such that the switching member 10 again connects the second amplifier 8 to the output port 3 and disconnects the memory element 9 from the output port 3. Accordingly, the circuit 1 is in its normal operation mode again.

The predetermined period of time is chosen such that the glitch has faded away in the signal provided by the second amplifier 6. Accordingly, after the predetermined period of time, the product of the gain of the first amplifier 5 and gain of the second amplifier 6 is constant. In other words, the predetermined period of time is chosen such that the first amplifier 5 can adjust to the change of its gain during the predetermined period of time.

The circuit 1 provides the advantage that the transient glitch is removed from the output signal of the circuit 1. During the time, when the glitch is present, the output signal of the second amplifier 6 is not provided to the output port 3. Instead, the output signal from the memory element 9 is provided to the output port 3. This signal is free from the glitch. Thus, the glitch is effectively removed from the output signal of the circuit 1.

When repeating the prior N values of the second amplifier 6 at the output port 3, this also introduces another distortion of the output signal. However, this distortion is different and smaller in amplitude than the transient glitch created by the change of the two gain settings. Further, due to the limited bandwidth and masking effects of human hearing, the new distortion is not audible, or is at least much less audible. In particular, if the predetermined period of time is sufficiently short, the alteration to the memory element 9 and back to the second amplifier 6 is not audible.

As another example a situation is considered wherein the control unit 8 detects that its input signal is below the second threshold level. In this case, the control unit 8 increases the variable gain of the first amplifier 5 by a given factor and simultaneously decreases the variable gain of the second amplifier 6 by the same given factor. Again, the given factor can in principle have any value and the exact value of the given factor depends on the programming of the control unit 8.

The control unit 8 further orders the memory element 9 to stop storing further values from the output signal of the second amplifier 6 and, instead, to provide the stored sample as an output signal. Simultaneously, the control unit 8 orders the switching member 10 to connect the output port 3 to the memory element 9 and to disconnect the output port 3 from the second amplifier 6.

The N values stored in the memory element 9 are fed to the output port 3 in a first-in, first-out manner. This is repeated M times. After a predetermined period of time corresponding to N-times M clock cycles, the control signal of the control unit 8 is again inverted, thereby connecting the output port 3 again to the second amplifier 6 and disconnecting the output port 3 from the memory element 9. Further, the control signal orders the memory element 9 to store new values from the output of the second amplifier 6 after the predetermined period of time is elapsed.

The circuit 1 shown in FIG. 1 is implemented on a single chip. In an alternative embodiment, the analog components and the analog-to-digital converter 7 may be implemented on a first chip and the remaining part of the circuit 1 may be implemented on one or more integrated circuits. This could be a dedicated digital integrated circuit or a digital signal processor. The separation of the circuit 1 in an analog part and a digital part is indicated in FIG. 1 with a dashed line 14.

In an alternative embodiment, the memory element 9 is configured to provide a signal which is an extrapolation of the stored sample when the memory element 9 is connected to the output port 3. Thus, instead of repeating M times the sample consisting of the last N output values of the second amplifier 6, an extrapolation of the output signal of the second amplifier 6 is provided.

For this purpose, the memory element 9 may be configured to carry out a filtering of the output signal of the second amplifier 6 such that the influence of noise is reduced. The filtering of the output signal may correspond to a smoothing of the signal.

Further, the memory element 9 is configured to estimate the slope of the stored sample. In particular, during normal operation mode of the circuit 1, the memory element 9 is configured to continuously carry out an estimation of the slope of the output signal of the second amplifier 6.

The estimation of the slope of the output signal is based on two values of the filtered signal of the second amplifier 6. These two values are continuously evaluated to be able to continuously estimate the output signal slope.

The slope may alternatively be estimated based on the output signal of the analog-to-digital converter 7. The output signal of the analog-to-digital converter 7 may be fed as an input signal to the memory element 9 such that the memory element 9 can calculate the slope from this signal.

The memory element 9 is configured such that, when it is connected to the output port 3, it provides an output signal corresponding to the stored sample plus an added value based on the estimated slope.

It is assumed that the memory element 9 has estimated a slope S. The memory element 9 will provide a first output signal consisting of the stored N values wherein the slope S is added to each value. Afterwards the memory element 9 provides an output signal corresponding to the previously provided sample plus again an added value S of the estimated slope. Thus, the provided signal corresponds of the stored N values plus 2 times the slope S. This is repeated M times. Accordingly, in the last cycle, the output signal of the memory element 9 consists of the stored N values plus M times the slope S.

After the predetermined period of time, the switching member 10 again connects the second amplifier 6 to the output port 3. Simultaneously, the switching member 10 disconnects the memory element 9 from the output port 3.

Figure 2:
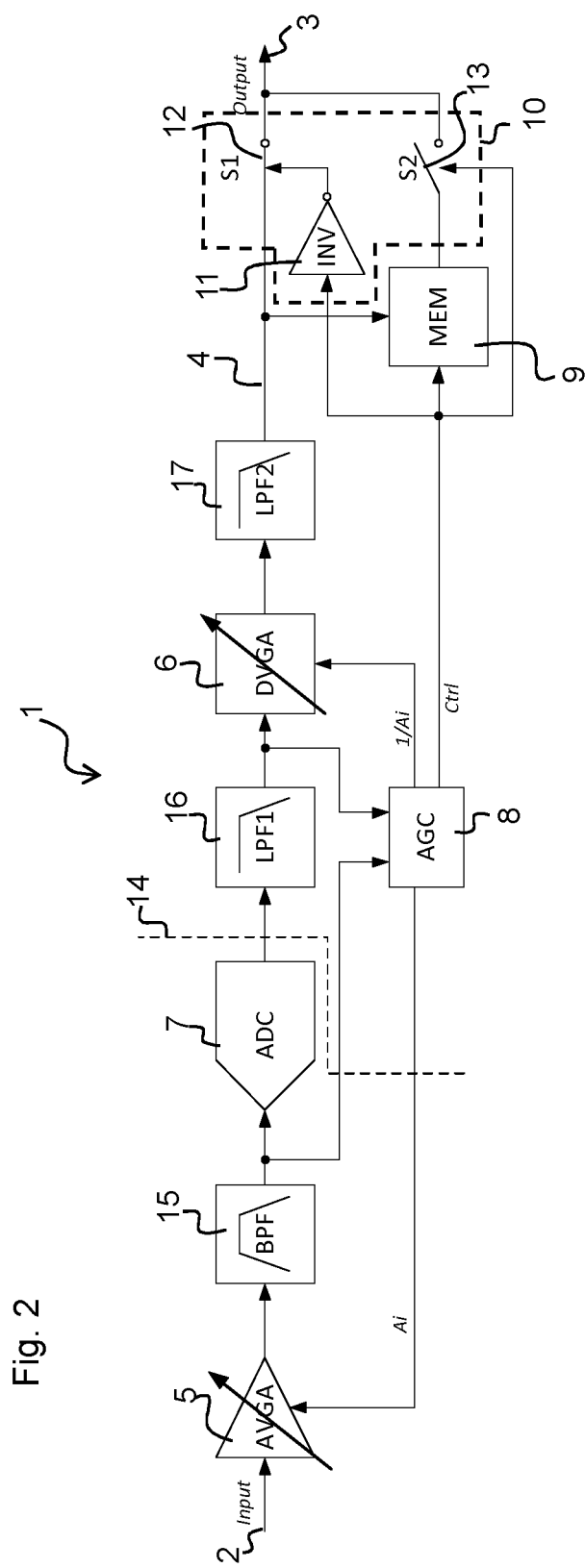
FIG. 2 shows a second embodiment of the circuit shown in FIG. 1 wherein optional filters have been added.

Further, FIG. 2 shows a second embodiment of the circuit 1 wherein optional filters have been added.

In particular, an analog band-pass filter 15 has been added in the main signal path 4 between the first amplifier 5 and the analog-to-digital converter 7. The analog band-pass filter 15 receives the signal provided by the first amplifier 5 as an input signal. Further, the analog band-pass filter 15 is configured to filter said signal and to provide a corresponding output signal which is further processed by the analog-to-digital converter 7. The output signal of the analog band-pass filter 15 is also provided to the control unit 8 as an input signal. In an alternative design, the control unit 8 may be configured to receive the output signal of the first amplifier 5 as an input signal.

Further, a first digital low-pass filter 16 and a second digital low-pass filter 17 have been added to the main signal path 4. The first digital low-pass filter 16 is arranged between the analog-to-digital converter 7 and the second amplifier 6. The second digital low-pass filter 17 is arranged between the second amplifier 6 and the output port 3.

In the embodiment shown in FIG. 2, the control unit 8 is configured to receive an output signal of the first digital low-pass filter 16 as an input signal. In an alternative design, the control unit 8 may be configured to receive an output signal of the analog-to-digital converter 7 as an input signal.

Further, in the embodiment shown in FIG. 2, the memory element 9 is configured to receive an output signal of the second digital low-pass filter 17 as an input signal. In an alternative design, the memory element 9 may be configured to receive an output signal of the second amplifier 6 as an input signal.

Each of the analog band-pass filter 15, the first digital low-pass filter 16 and the second digital low-pass filter 17 is optional. Other embodiments may also exchange the filters 15, 16, 17 into other types of filters including, but not limited to, bandpass filters, lowpass filters, highpass filters and all-pass filters, or a combination of different types of filters. The order of the filters may be any order.

REFERENCE NUMERALS 1 circuit
2 input port
3 output port
4 main signal path
5 first amplifier
6 second amplifier
7 analog-to-digital converter
8 control unit
9 memory element
10 switching member
11 inverter
12 first switch
13 second switch
14 dashed line
15 analog band-pass filter
16 first digital low-pass filter
17 second digital low-pass filter

We claim:
1. A circuit comprising,
a first amplifier with a variable gain,
a second amplifier with a variable gain configured to provide an output signal,
a control unit configured to adjust the variable gain of the first amplifier and the variable gain of the second amplifier,
a memory element configured to store a sample of the output signal, and
a switching member configured to connect an output port of the circuit either to the second amplifier or to the memory element, wherein the second amplifier is a digital amplifier.
2. The circuit according to claim 1,
wherein the memory element is configured to provide a signal to the output port when the output port is connected to the memory element, and
wherein the signal provided by the memory element is based on the stored sample.
3. The circuit according to claim 1,
wherein the memory element is configured to provide a signal to the output port when the output port is connected to the memory element, and
wherein the signal provided by the memory element is identical to the stored sample.
4. The circuit according to claim 1,
wherein the memory element is configured to provide a signal to the output port when the output port is connected to the memory element, and
wherein the signal provided by the memory element is an extrapolation of the stored sample.
5. The circuit according to claim 1,
wherein the circuit is configured such that the switching member connects the output port to the memory element for a predetermined period of time when the control unit adjusts the variable gain of the first amplifier and the variable gain of the second amplifier.
6. The circuit according to claim 5,
wherein the circuit is configured such that the switching member connects the output port to the second amplifier after the predetermined period of time.
7. The circuit according to claim 1,
wherein the circuit is configured such that, when the output port is connected to the second amplifier, the output signal of the second amplifier is written into the memory element and the memory element constantly overwrites a previously stored sample in a first-in, first-out manner.
8. The circuit according to claim 1,
wherein the circuit is configured such that the memory element is prevented from overwriting the stored sample when the output port is connected to the memory element.
9. The circuit according to claim 1,
wherein the control unit is configured to adjust the variable gain of the second amplifier reciprocally proportional and simultaneously to an adjustment of the variable gain of the first amplifier.
10. The circuit according to claim 1,
wherein the first amplifier is an analog amplifier.
11. The circuit according to claim 1,
further comprising an analog-to-digital converter arranged between the first amplifier and the second amplifier.
12. The circuit according to claim 1,
further comprising at least one filter.
13. Method of operating a circuit,
wherein the circuit comprises a first amplifier with a variable gain,
a second amplifier with a variable gain configured to provide an output signal,
a control unit configured to adjust the variable gain of the first amplifier and the variable gain of the second amplifier,
a memory element configured to store a sample of the output signal, and
a switching member configured to connect an output port of the circuit either to the second amplifier or to the memory element;
the method comprising the steps of:
monitoring a first output signal of the first amplifier,
adjusting the variable gain of the first amplifier and the variable gain of the second amplifier if the first output signal is below a first predefined threshold level or above a second predefined threshold level,
connecting the memory element to the output port for a predetermined period of time if the variable gain of the first amplifier and the variable gain of the second amplifier are adjusted.
14. Method according to claim 13, further comprising the step of:
connecting the second amplifier to the output port after the predetermined period of time.
15. The circuit according to claim 1, wherein the first amplifier and the second amplifier are arranged in a main signal path of the circuit.

16. The circuit according to claim 2, wherein the signal provided by the memory element is identical to the stored sample or an extrapolation of the stored sample.

17. The circuit according to claim 2,
wherein the circuit is configured such that the switching member connects the output port to the memory element for a predetermined period of time when the control unit adjusts the variable gain of the first amplifier and the variable gain of the second amplifier.

18. The circuit according to claim 2,
wherein the circuit is configured such that, when the output port is connected to the second amplifier, the output signal of the second amplifier is written into the memory element and the memory element constantly overwrites a previously stored sample in a first-in, first-out manner.

19. A circuit comprising,
a first amplifier with a variable gain,
a second amplifier with a variable gain configured to provide an output signal,
a control unit configured to adjust the variable gain of the first amplifier and the variable gain of the second amplifier,
a memory element configured to store a sample of the output signal, and
a switching member configured to connect an output port of the circuit either to the second amplifier or to the memory element,
wherein the memory element is configured to provide a signal to the output port when the output port is connected to the memory element, and
wherein the signal provided by the memory element is an extrapolation of the stored sample.

20. A circuit comprising,
a first amplifier with a variable gain,
a second amplifier with a variable gain configured to provide an output signal,
a control unit configured to adjust the variable gain of the first amplifier and the variable gain of the second amplifier,
a memory element configured to store a sample of the output signal, and
a switching member configured to connect an output port of the circuit either to the second amplifier or to the memory element,
wherein the circuit is configured such that the memory element is prevented from overwriting the stored sample when the output port is connected to the memory element.

21. A circuit comprising,
a first amplifier with a variable gain,
a second amplifier with a variable gain configured to provide an output signal,
a control unit configured to adjust the variable gain of the first amplifier and the variable gain of the second amplifier,
a memory element configured to store a sample of the output signal, and
a switching member configured to connect an output port of the circuit either to the second amplifier or to the memory element,
wherein the control unit is configured to adjust the variable gain of the second amplifier reciprocally proportional and simultaneously to an adjustment of the variable gain of the first amplifier.

22. A circuit comprising,
a first amplifier with a variable gain,
a second amplifier with a variable gain configured to provide an output signal,
a control unit configured to adjust the variable gain of the first amplifier and the variable gain of the second amplifier,
a memory element configured to store a sample of the output signal,
a switching member configured to connect an output port of the circuit either to the second amplifier or to the memory element, and
an analog-to-digital converter arranged between the first amplifier and the second amplifier.

* * * * *